United States Patent
Tsai

(10) Patent No.: US 11,903,194 B2
(45) Date of Patent: Feb. 13, 2024

(54) INTEGRATED CIRCUIT

(71) Applicant: MACRONIX International Co., Ltd., Hsinchu (TW)

(72) Inventor: Ya-Chun Tsai, Hsin-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 240 days.

(21) Appl. No.: 17/529,027

(22) Filed: Nov. 17, 2021

(65) Prior Publication Data
US 2023/0157018 A1 May 18, 2023

(51) Int. Cl.
| | | |
|---|---|---|
| G11C 5/02 | (2006.01) | |
| H10B 43/10 | (2023.01) | |
| G11C 16/26 | (2006.01) | |
| G11C 16/08 | (2006.01) | |
| H10B 41/10 | (2023.01) | |

(52) U.S. Cl.
CPC .............. H10B 43/10 (2023.02); G11C 16/08 (2013.01); G11C 16/26 (2013.01); H10B 41/10 (2023.02)

(58) Field of Classification Search
CPC ........... G11C 5/025; G11C 5/04; G11C 5/063; G11C 11/4097; G11C 15/043
USPC ...................................................... 365/51, 63
See application file for complete search history.

(56) References Cited

U.S. PATENT DOCUMENTS

| | | | |
|---|---|---|---|
| 6,150,728 A | 11/2000 | Tsukude et al. | |
| 8,853,818 B2* | 10/2014 | Lue | H10B 43/27 |
| | | | 438/131 |
| 2004/0004897 A1* | 1/2004 | Kang | G11C 5/063 |
| | | | 365/230.03 |
| 2020/0365225 A1* | 11/2020 | Na | G11C 29/38 |

FOREIGN PATENT DOCUMENTS

| | | |
|---|---|---|
| TW | 429603 | 4/2001 |
| TW | 201639118 | 11/2016 |

OTHER PUBLICATIONS

"Office Action of Taiwan Counterpart Application", dated Apr. 28, 2022, p. 1-p. 7.

* cited by examiner

*Primary Examiner* — Son T Dinh
(74) *Attorney, Agent, or Firm* — J.C. PATENTS

(57) ABSTRACT

In one embodiment of this disclosure, an integrated circuit includes at least one first memory block, at least one second memory block, and a pad disposing area. The first memory block and the second memory block are respectively disposed at two sides of the integrated circuit, wherein each of the first memory block and the second memory block includes a memory cell array having a three-dimension structure. The first memory block and the second memory block are symmetrically disposed about the pad disposing area. A plurality of pads are disposed in the pad disposing area. The pads are respectively electrically coupled to the first memory block and the second memory block.

14 Claims, 7 Drawing Sheets

INTEGRATED CIRCUIT

BACKGROUND

Technical Field

The disclosure relates to an integrated circuit, and particularly, to an integrated circuit in which a layout area can be reduced.

Description of Related Art

In the conventional technical field, in a memory chip, a pad disposing area is disposed on the periphery of an integrated circuit. In such configuration, when the integrated circuit includes a plurality of memory blocks, transmission wires may typically be required to achieve electrical coupling between pads and memory blocks at a relatively long distance by a complicated wire-winding through a relatively long wiring route. As such, an additional area may typically be required to be disposed in the integrated circuit to accommodate the transmission wires, increasing the layout area. Moreover, the overly long transmission wires may typically provide excess parasitic resistance, and excess parasitic capacitance may also be formed between the transmission wires. Such parasitic effects may also reduce the quality of signals and power transmitted through the transmission wires, affecting the performance of the integrated circuit.

SUMMARY

At least one embodiment of the disclosure provides a plurality of integrated circuits, in which the length of a transmission wire between pads and memory blocks can be reduced, the layout area of the integrated circuit can be reduced, and the efficiency of signal transmission can be improved.

An integrated circuit of one embodiment of the disclosure includes at least one first memory block, at least one second memory block, and a pad disposing area. The first memory block and the second memory block are respectively disposed at two sides of the integrated circuit, wherein each of the at least one first memory block and the at least one second memory block include a memory cell array having a three-dimensional architecture. The first memory block and the second memory block are symmetrically disposed about the pad disposing area. A plurality of pads are disposed in the pad disposing area. The pads are respectively electrically coupled to the first memory block and the second memory block.

An integrated circuit of another embodiment of the disclosure includes two adjacent first memory blocks, two adjacent second memory blocks and a pad disposing area. The two adjacent first memory blocks and the two adjacent second memory blocks are respectively disposed on two sides of the integrated circuit. Wherein each two first memory blocks and two second memory blocks include a memory cell array having a three-dimensional architecture and a shortest spacing distance between the memory cell array of the two adjacent first memory blocks. The pad disposing area disposed between two adjacent first memory blocks and two adjacent second memory blocks, wherein a plurality of pads are disposed in the pad disposing area, and the pads are respectively electrically coupled to the two adjacent first memory blocks and the two adjacent second memory blocks.

Based on the foregoing, in the integrated circuit of the embodiments of the disclosure, the first memory block and the second memory block are symmetrically disposed about the pad disposing area, so that the first memory block and the second memory block can be electrically coupled to adjacent pads in the pad disposing area. Accordingly, the length of the transmission wires that connect the pads with the first memory block and the second memory block can be effectively reduced. Moreover, since it is not required to dispose an additional layout region for the transmission wires to be disposed, the area of the required layout region can be effectively reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
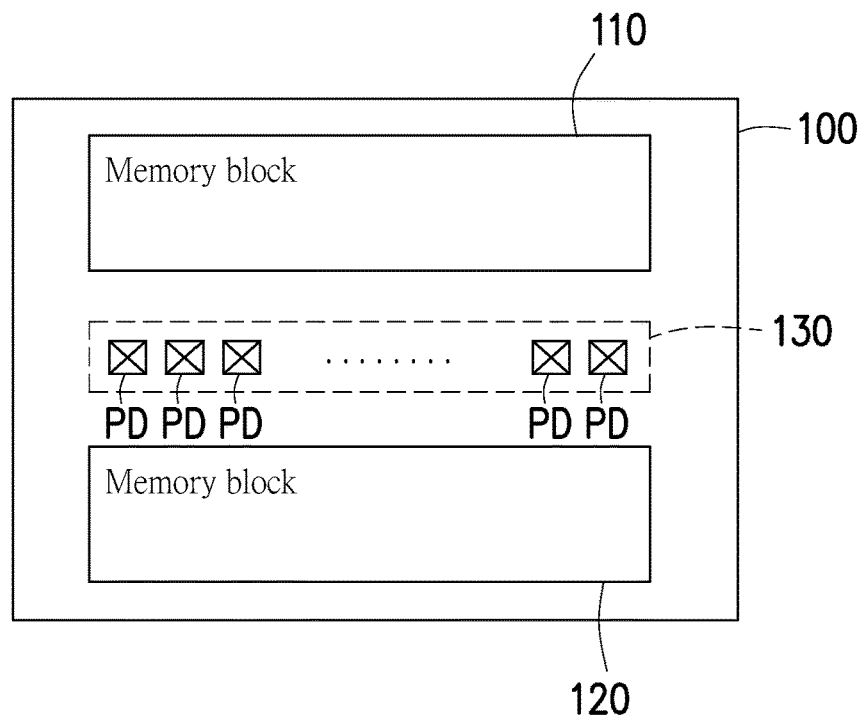
FIG. 1 is a schematic view of an integrated circuit according to an embodiment of the disclosure.

With reference to FIG. 1, FIG. 1 is a schematic view of an integrated circuit according to an embodiment of the disclosure. An integrated circuit 100 includes memory blocks 110 and 120 and a pad disposing area 130. The memory blocks 110 and 120 are respectively disposed on two sides of the integrated circuit 100, and the memory blocks 110 and 120 are symmetrically disposed about the pad disposing area 130. Specifically, the pad disposing area 130 may be located at the center of the integrated circuit 100.

The pad disposing area 130 has a plurality of pads PD. The pads PD are respectively electrically coupled to the memory blocks 110 and 120 through a plurality of transmission wires. In this embodiment, the pads PD may be input and output pads (I/O pads). Each of the pads PD can serve as a transmission medium for transmitting signals or power voltages.

In addition, in this embodiment, the memory blocks 110 and 120 may have the same circuit architecture and are symmetrically distributed at two sides of the pad disposing area 130. By this layout, both the memory blocks 110 and 120 can be adjacent to the pad disposing area 130. A plurality of transmission wires between the memory blocks 110 and 120 and the corresponding pads PD may be utilized to achieve the electrical coupling between the memory blocks 110 and 120 and the corresponding pad PD without wire-winding. In other words, the length of the transmission wires between the memory blocks 110 and 120 and the corresponding pads PD can be effectively reduced, the layout area required for the transmission wires can be reduced, and the equivalent resistance of the transmission wires can be reduced, which improves the transmission efficiency of transmission signals and the power voltages.

Figure 2:
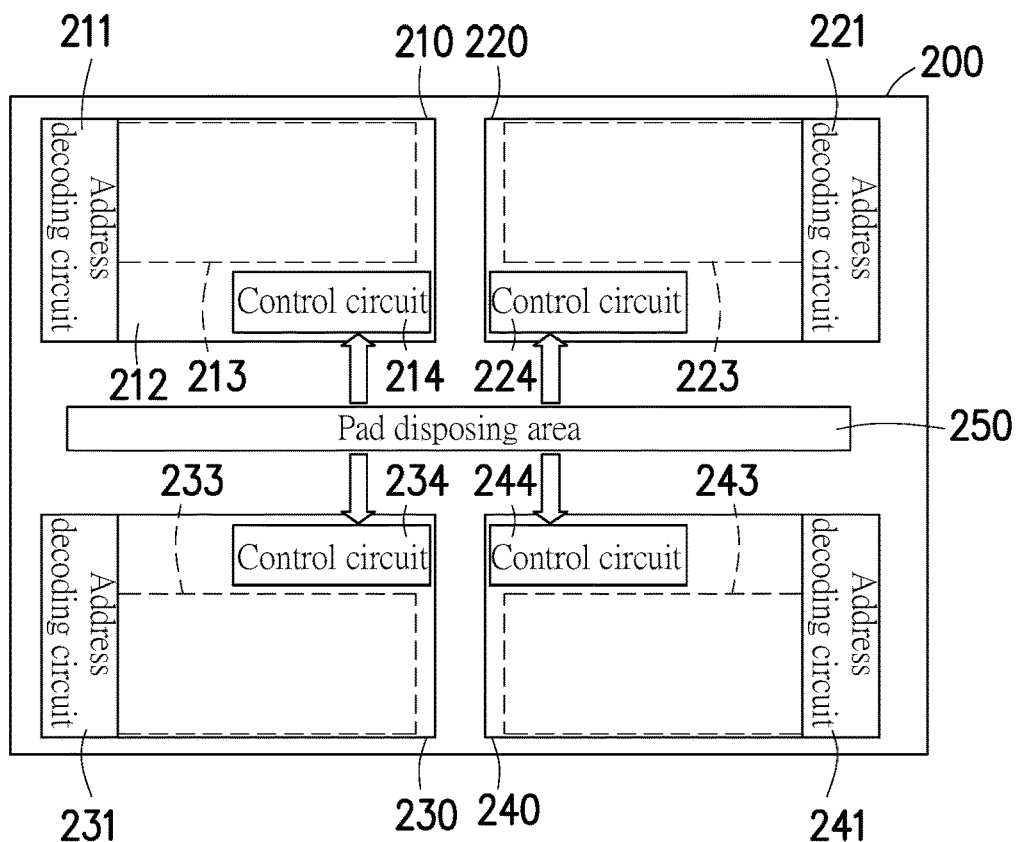
FIG. 2 is a schematic view of an integrated circuit according to another embodiment of the disclosure.

Next, with reference to FIG. 2, FIG. 2 is a schematic view of an integrated circuit according to another embodiment of the disclosure. An integrated circuit 200 includes memory blocks 210, 220, 230, 240, and a pad disposing area 250. The memory blocks 210 and 220 are disposed on the same first side of the integrated circuit 200, and the memory blocks 230 and 240 are disposed on the same second side of the integrated circuit 200. The pad disposing area 250 is disposed between the first side and the second side. In other words, the memory blocks 210 and 230 are symmetrical about the pad disposing area 250, and the memory blocks 220 and 240 are also symmetrical about the pad disposing area 250.

In addition, the memory block 210 includes an address decoding circuit 211, a memory cell array 212, a sensing circuit 213, and a control circuit 214. The memory block 220 includes an address decoding circuit 221, a memory cell array 222, a sensing circuit 223, and a control circuit 224. The memory block 230 includes an address decoding circuit 231, a memory cell array 232, a sensing circuit 233, and a control circuit 234. The memory block 240 includes an address decoding circuit 241, a memory cell array 242, a sensing circuit 243, and a control circuit 244. In this embodiment, the memory blocks 210, 220, 230, and 240 have the same circuit architecture.

Taking the memory block 210 in this embodiment as an example, the memory cell array 212 is a memory cell array having a three-dimensional architecture. In other words, the memory cell array 212 may be a three-dimensional NOR, AND, or NAND type flash memory cell array.

The memory cell array 212 may be stacked above the sensing circuit 213. The sensing circuit 213 is configured to sense readout data provided by the memory cell array 212. The address decoding circuit 211 is configured to provide an address signal and cause the memory cell array 212 to perform an access operation according to the address signal. The control circuit 214 is configured to generate a control signal to control the access operation of the memory cell array 212.

In this embodiment, the control circuits 214 to 244 of the memory blocks 210 to 240 are all disposed adjacent to the pad disposing area 250. Each of the control circuits 214 to 244 includes a plurality of terminals. The terminals are electrically coupled to the corresponding pads in the pad disposing area 250. The control circuits 214 and 234 may be symmetrically disposed about the pad disposing area 250. Similarly, the control circuits 224 and 244 may also be symmetrically disposed about the pad disposing area 250. Accordingly, the terminals in the control circuits 214, 224, 234, and 244 may be electrically coupled to the pads in the pad disposing area 250 through transmission wires with a short wire length.

Incidentally, in the integrated circuit 200 of this embodiment, the number of memory blocks is 4, that is, $2^2$.

Figure 3:
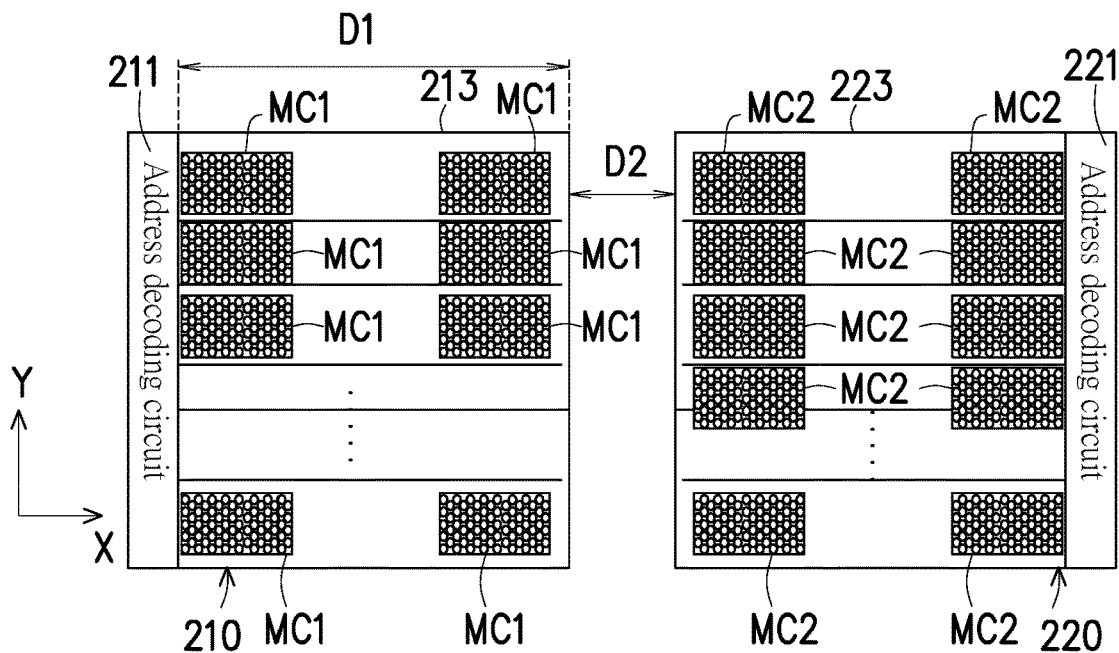
FIG. 3 is a partially enlarged view of the memory blocks 210, 230 of the embodiment of FIG. 2.

Next, with reference to FIG. 3, FIG. 3 is a partially enlarged view of the memory blocks 210, 220 of the embodiment of FIG. 2. On a coordinate plane formed by X axis and Y axis, in the memory block 210, a plurality of memory cell groups MC1 form the memory cell array 212. Some of the memory cell groups MC1 are stacked on the sensing circuit 213. The address decoding circuit 211 is disposed adjacent to the sensing circuit 213 and the memory cell groups MC1. The address decoding circuit 211 is configured to provide an address signal to the memory cell array 212. Similarly, in the memory block 220, a plurality of memory cell groups MC2 form the memory cell array 222. Some of the memory cell groups MC2 are stacked on the sensing circuit 223. The address decoding circuit 221 is disposed adjacent to the sensing circuit 223 and the memory cell groups MC2. The address decoding circuit 221 is configured to provide an address signal to the memory cell array 222.

It is worth noting that, in this embodiment, it is possible to perform the layout of the transmission wires between the memory blocks 210 and 220 and the pads without using the region between the memory blocks 210 and 220. The region between the memory blocks 210 and 220 may be provided for the layout of the peripheral circuits of the memory blocks 210 and 220, and an excessive area is not required. Therefore, in this embodiment, a shortest spacing distance D2 between a memory cell array of the memory block 210 and a memory cell array of the memory block 220 may be less than 1/200 of a length D1 of a memory cell array of the memory block 210. It follows that the distance between the memory blocks 210 and 220 can be effectively reduced.

Figure 4:
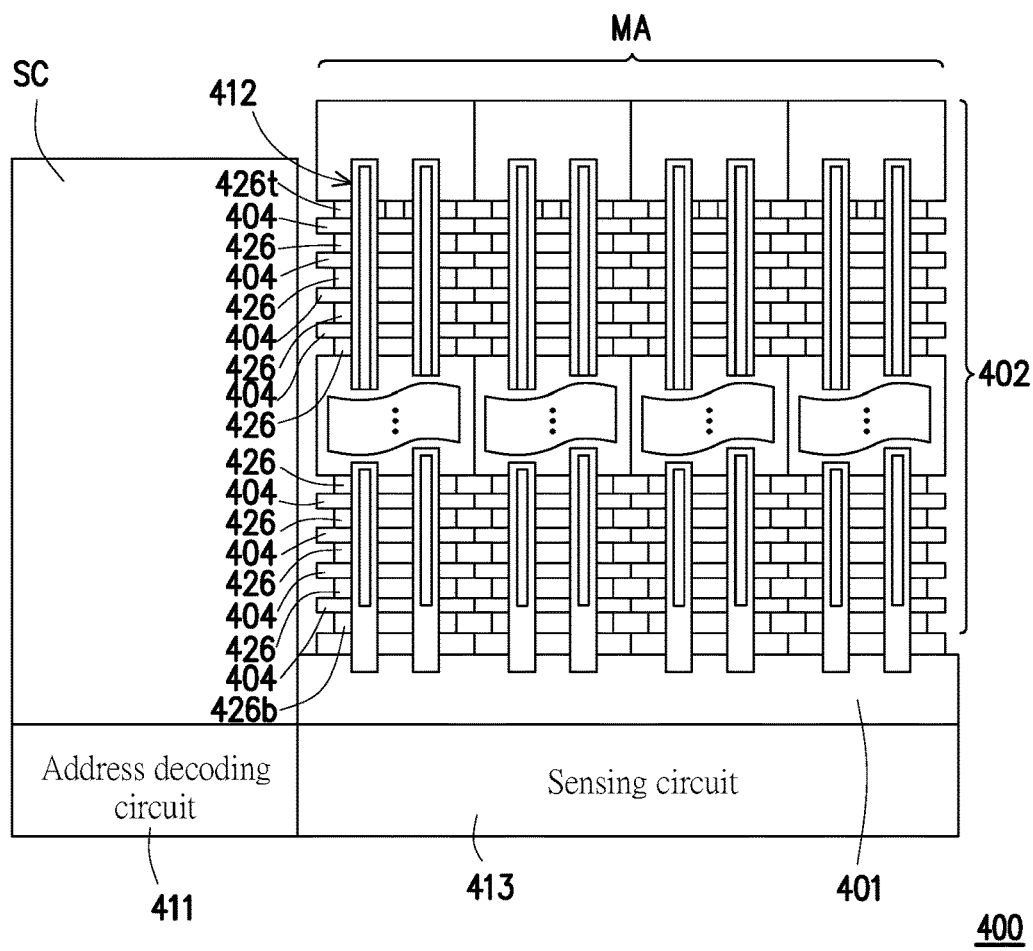
FIG. 4 is a cross-sectional view of a memory block in an integrated circuit according to an embodiment of the disclosure.

Next, FIG. 4 is a cross-sectional view of a memory block in an integrated circuit along X axis of FIG. 3 according to an embodiment of the disclosure. A memory block 400 includes an address decoding circuit 411, a memory cell array MA, and a sensing circuit 413. The address decoding circuit 411 is disposed adjacent to the sensing circuit 413. The address decoding circuit 411 is coupled to the memory cell array MA through a plurality of wires in a staircase structure SC. The staircase structure SC includes a plurality of word line landing areas configured in a staircase shape. The memory cell array MA includes a plurality of stack structures (e.g., a stack structure 402). The stack structure 402 may be formed on a conductive layer 401. The stack structure 402 includes a plurality of first materials (e.g., dielectric layers) 404 and a plurality of conductor layers (word lines) 426 that are alternately stacked. A vertical channel structure 420 penetrates the stack structure 402. A charge storage structure 412 surrounds the side wall of the vertical channel structure 420. As shown in FIG. 4, the sensing circuit 413 is under the memory cell array MA. The address decoding circuit 411 is under the staircase structure SC. Also, a control circuit (not shown) is under the memory cell array MA. In FIG. 4, the topmost conductor layer 426t may serve as a string selection line (SSL), and the bottommost conductor layer 426b may serve as a ground selection line (GSL).

Figure 5:
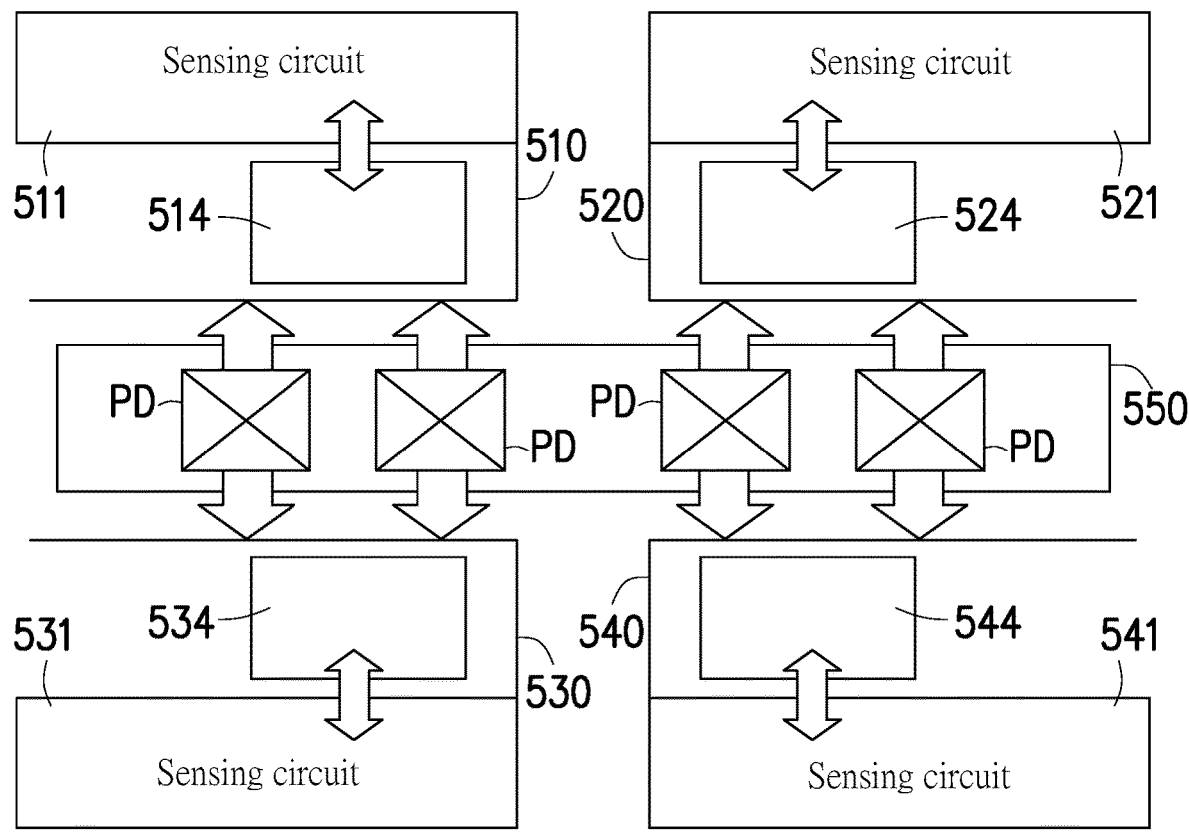
FIG. 5 is a schematic view showing the positional relationship between memory blocks and a pad disposing area in an integrated circuit according to an embodiment of the disclosure.

Next, with reference to FIG. 5, FIG. 5 is a schematic view showing the positional relationship between memory blocks and a pad disposing area in an integrated circuit according to an embodiment of the disclosure. An integrated circuit 500 includes memory blocks 510 to 540 and a pad disposing area 550. The memory block 510 includes a sensing circuit 511 and a control circuit 514. The memory block 520 includes a sensing circuit 521 and a control circuit 524. The memory block 530 includes a sensing circuit 531 and a control circuit 534. The memory block 540 includes a sensing circuit 541 and a control circuit 544.

The memory blocks 510 and 530 are symmetrically disposed about the pad disposing area 550. Similarly, the memory blocks 520 and 540 are also symmetrically disposed about the pad disposing area 550. Accordingly, the control circuit 514 in the memory block 510, the control circuit 524 in the memory block 520, the control circuit 534 in the memory block 530, and the control circuit 544 in the memory block 540 may each be electrically coupled to the adjacent pads in the pad disposing area 550 through transmission wires at a short distance. As such, the length of the transmission wires between the control circuits 514 to 544 and the corresponding pads PD can be effectively reduced. Moreover, wire-winding is not required for the wiring arrangement of the transmission wires, which can effectively reduce the layout area.

In this embodiment, each of the pads PD may be configured to transmit a power voltage or a ground voltage. Alternatively, each of the pads PD may also be configured to transmit and receive transmission signals, which is not particularly limited.

Incidentally, the control circuits 514 to 544 are respectively coupled to the sensing circuits 511 to 541. In addition, the control circuits 514 to 544 transmit signals to respectively control the sensing actions of readout data by the sensing circuits 511 to 541.

Figure 6A:
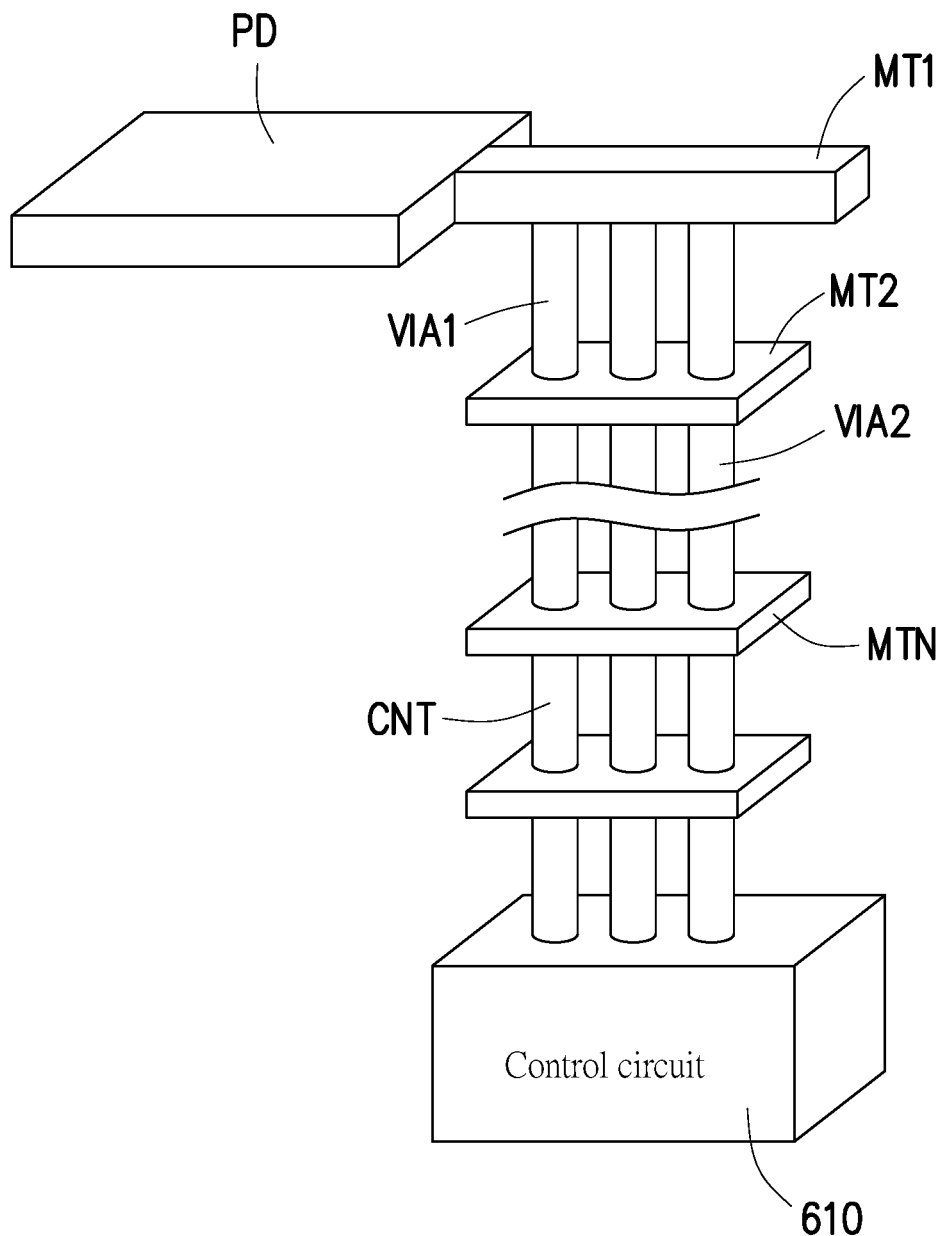
FIG. 6A and FIG. 6B are respectively schematic views of different implementations of the coupling relationship between a control circuit and a pad in an integrated circuit according to an embodiment of the disclosure.
Figure 6B:
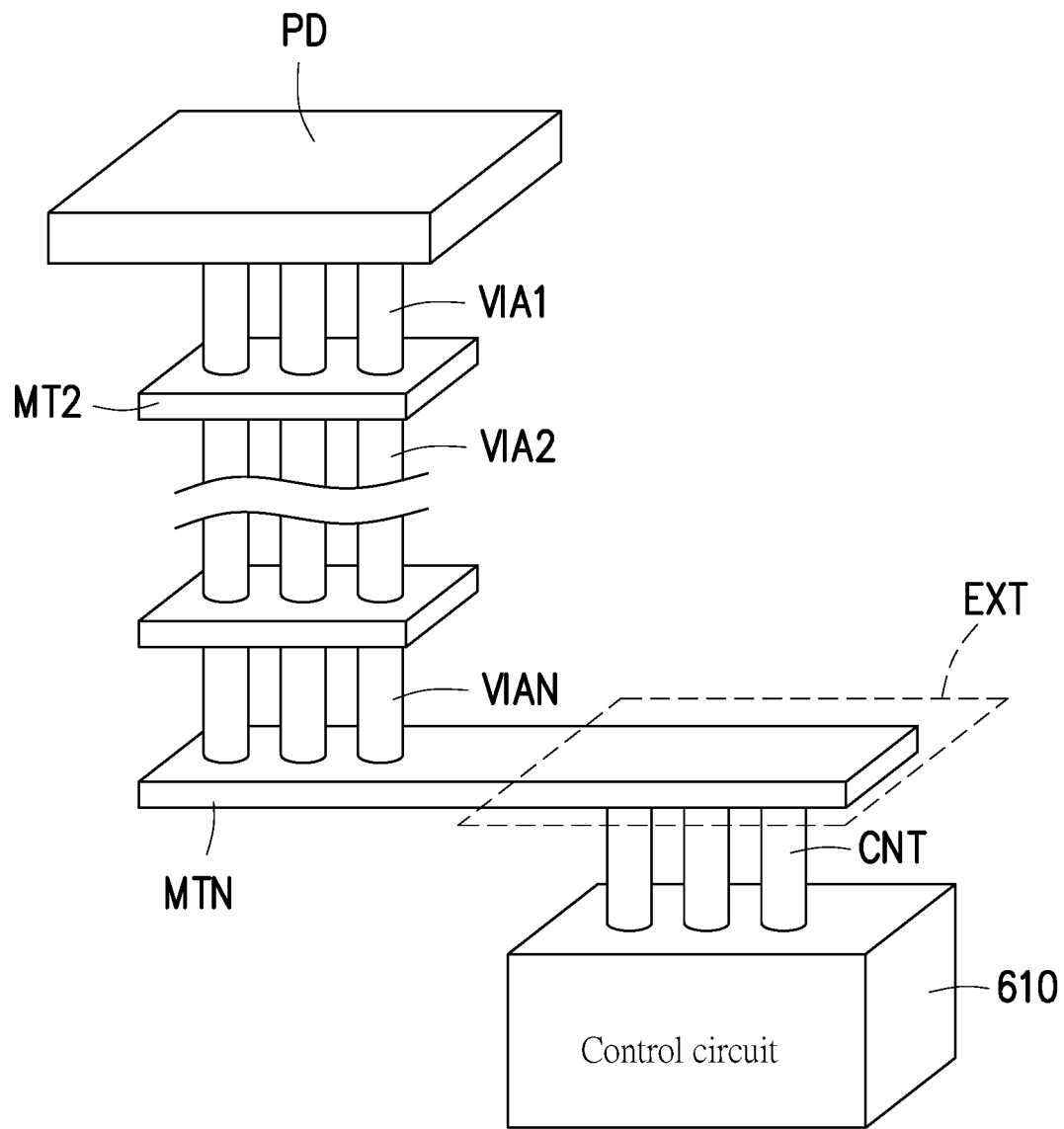

Regarding the details of electrical coupling between the control circuits 514 to 544 and the pads, reference may be made to FIG. 6A and FIG. 6B, which are respectively schematic views of different implementations of the coupling relationship between a control circuit and a pad in an integrated circuit according to an embodiment of the disclosure. In FIG. 6A, the pad PD is disposed in the pad disposing area of the integrated circuit, and may serve as a transmission and reception medium for a power voltage or a ground voltage. In this embodiment, the pad PD is directly connected to a metal layer MT1 of the first layer. The metal layer MT1 in turn is connected to a metal layer MT2 through a connecting structure VIA1. The metal layer MT2 in turn is connected to the next metal layer through a connecting structure VIA2. By analogy, a bottom metal layer MTN may be directly connected to a power receiving end of a control circuit 610 through a connecting structure CNT.

In the implementation of FIG. 6A, the vertical projection of the metal layer MT1 of the first layer may cover the power receiving end of the control circuit 610. In other words, electrical coupling between the pad PD and the power receiving end of the control circuit 610 may be formed under the circumstance of maximum reduction in layout area.

In FIG. 6B, in another embodiment, the pad PD is disposed in the pad disposing area of the integrated circuit, and may similarly serve as a transmission and reception medium for a power voltage or a ground voltage. The pad PD may be directly connected to the metal layer MT2 through the connecting structure VIA1. The metal layer MT2 may be connected to the next metal layer through the connecting structure VIA2. By analogy, through the connecting structures VIA1 to VIAN and the metal layers MT2 to MTN that are alternately arranged, the pad PD can be electrically coupled to the metal layer MTN.

It is worth noting that, in this embodiment, the metal layer MTN may include an extension portion EXT. The vertical projection plane of the extension portion EXT may cover the power receiving end of the control circuit 610. Moreover, the extension portion EXT of the metal layer MTN may be directly connected to the power receiving end of the control circuit 610 through the connecting structure CNT.

Similarly, through the implementation of FIG. 6B, electrical coupling between the pad PD and the power receiving end of the control circuit 610 may also be formed under the circumstance of maximum reduction in layout area.

Incidentally, in other implementations of the disclosure, the extension portion EXT may also be formed on any one of the metal layers MT2 to MTN, and is not required to be formed on the metal layer MTN.

Figure 7A:
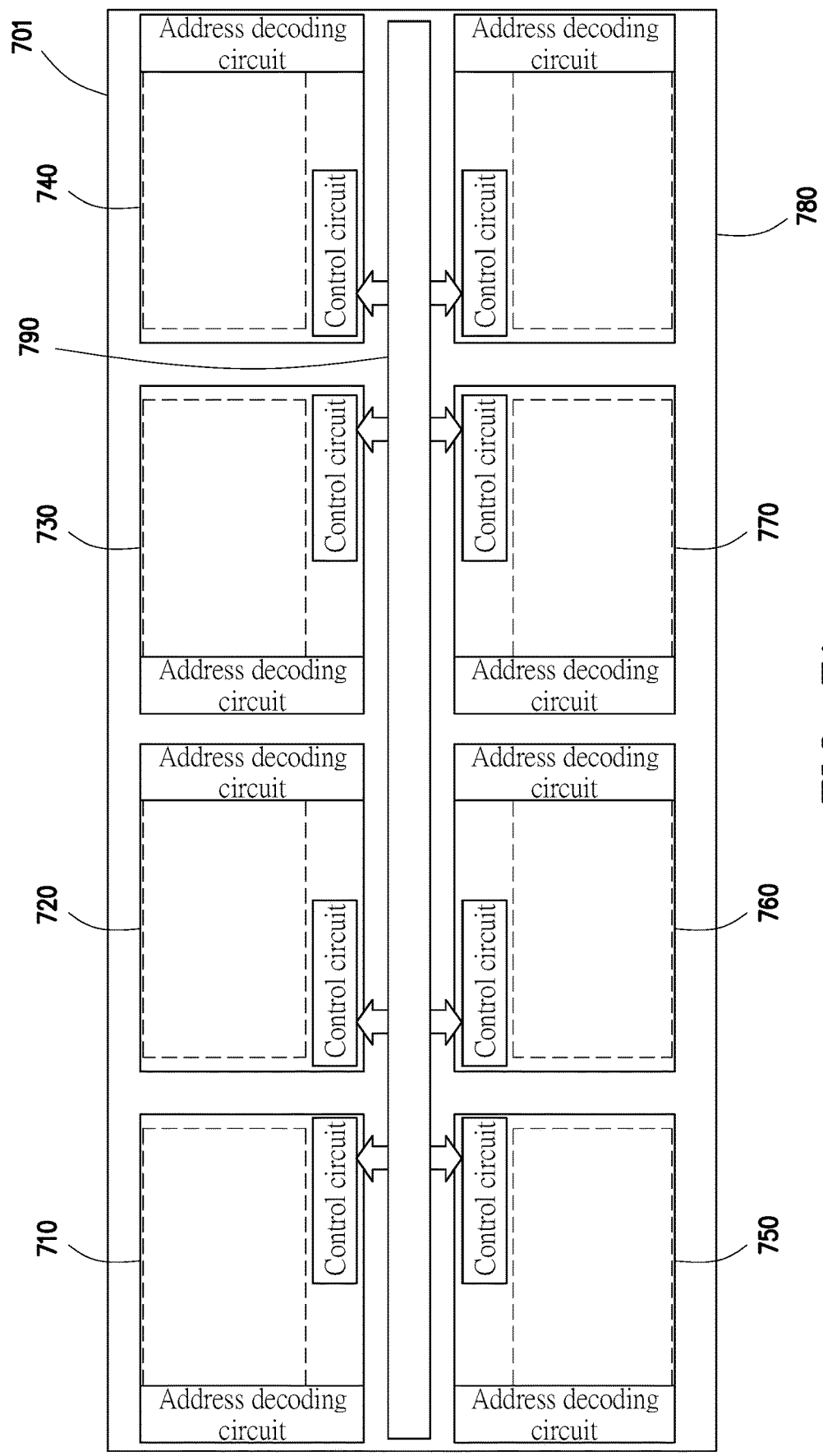
FIG. 7A and FIG. 7B are respectively schematic views of different implementations of an integrated circuit according to an embodiment of the disclosure.
Figure 7B:
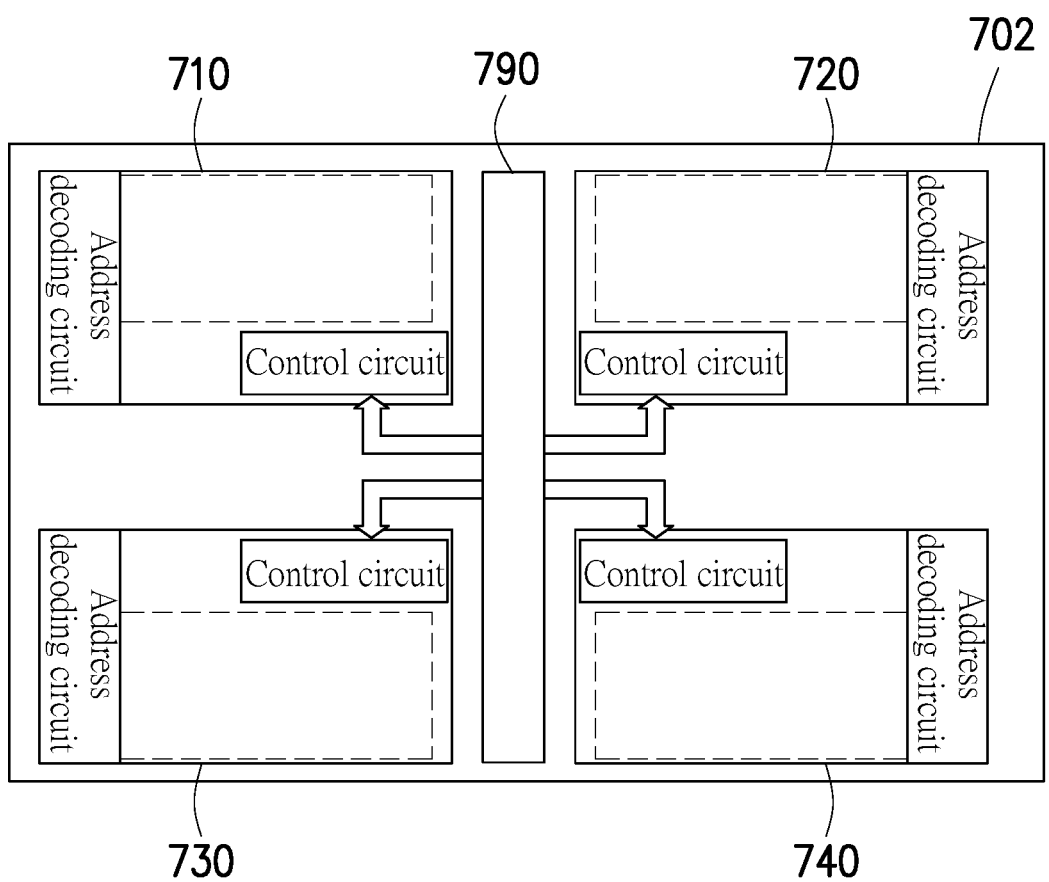

Next, with reference to FIG. 7A and FIG. 7B, FIG. 7A and FIG. 7B are respectively schematic views of different implementations of an integrated circuit according to an embodiment of the disclosure. In FIG. 7A, an integrated circuit 701 includes memory blocks 710 to 780 and a pad disposing area 790. In terms of positional configuration, the memory blocks 710 and 750 are symmetrical about the pad disposing area 790, the memory blocks 720 and 760 are symmetrical about the pad disposing area 790, the memory blocks 730 and 770 are symmetrical about the pad disposing area 790, and the memory blocks 740 and 780 are symmetrical about the pad disposing area 790. The memory blocks 710 to 780 may have the same circuit architecture.

In this embodiment, the number of memory blocks 710 to 780 in the integrated circuit 701 may be 8. In fact, in the embodiments of the disclosure, the number of memory blocks may be 2 to the power of N, where N may be an integer greater than or equal to zero.

In this embodiment, the memory blocks 710 to 740 are arranged in the same first row, and the memory blocks 750 to 780 are arranged in the same second row. The pad disposing area 790 is disposed between the first row and the second row in a direction of row.

In FIG. 7B, an integrated circuit 702 includes the memory blocks 710 to 740 and the pad disposing area 790. In terms of positional configuration, the memory blocks 710 and 720 are symmetrical about the pad disposing area 790, and the memory blocks 730 and 740 are symmetrical about the pad disposing area 790. The memory blocks 710 to 740 may have the same circuit architecture.

Different from the above embodiment, the pad disposing area 790 of this embodiment is disposed in a direction of column. The memory blocks 710 and 730 are disposed in the same first column, and the memory blocks 720 and 740 are disposed in the same second column. The pad disposing area 790 may be disposed between the first column and the second column.

In whichever of the embodiment of FIG. 7A or the embodiment of FIG. 7B, the electrical coupling path between the memory blocks and the pads in the pad disposing area can be effectively shortened, reducing the equivalent resistance of the transmission wires therebetween. Moreover, it is not required to connect the memory blocks with the pads in the pad disposing area through transmission wires that require wire-winding, which effectively reduces the area required for circuit layout.

In summary of the foregoing, in the integrated circuit of the disclosure, the pad disposing area is disposed between a plurality of memory blocks. Accordingly, the connection length of the transmission wires between the memory blocks and the corresponding pads in the pad disposing area can be effectively reduced. As such, the layout area of the integrated circuit can be effectively reduced, and the resistance provided by the transmission wires between the memory blocks and the pads can also be effectively reduced, which improves the quality of signal (power) transmission.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated circuit, comprising:
   at least one first memory block and at least one second memory block respectively disposed on two sides of the integrated circuit, wherein each of the at least one first memory block and the at least one second memory block includes a memory cell array having a three-dimensional architecture; and
   a pad disposing area, wherein the at least one first memory block and the at least one second memory block are symmetrically disposed about the pad disposing area, a plurality of pads are disposed in the pad disposing area, and the pads are respectively electrically coupled to the at least one first memory block and the at least one second memory blocks,
   wherein each of the at least one first memory block and the at least one second memory block comprises a control circuit generating a control signal to control an access operation of the corresponding memory cell array,
   wherein the control circuit of the at least one first memory block and the control circuit of the at least one second memory block are symmetrically disposed about the pad disposing area.

2. The integrated circuit according to claim 1, wherein the at least one first memory block and the at least one second memory block have same circuit architecture.

3. The integrated circuit according to claim 2, wherein each of the at least one first memory block and the at least one second memory block further comprises:
   an address decoding circuit configured to provide an address signal;
   the memory cell array performing the access operation according to the address signal; and
   a sensing circuit sensing a readout data provided by the memory cell array.

4. The integrated circuit according to claim 3, wherein the control circuit is disposed adjacent to the pad disposing area and is electrically coupled to the corresponding pads.

5. The integrated circuit according to claim 3, wherein the memory cell array is stacked on the sensing circuit.

6. The integrated circuit according to claim 3, wherein a power receiving end of the control circuit is electrically coupled to a power pad through a plurality of metal layers and a plurality of connecting structures, wherein the metal layers and the connecting structures are alternately arranged.

7. The integrated circuit according to claim 6, wherein the power pad is directly connected to a first metal layer, and a vertical projection plane of the first metal layer covers the power receiving end of the control circuit.

8. The integrated circuit according to claim 6, wherein one of the metal layers comprises an extension portion, and a vertical projection plane of the extension portion covers the power receiving end of the control circuit.

9. The integrated circuit according to claim 1, wherein the memory cell array is a NOR type flash memory cell array, an AND type flash memory cell array, or an NAND type flash memory cell array.

10. The integrated circuit according to claim 1, wherein a number of the at least one first memory block is equal to 2 to a power of N, where N is an integer greater than or equal to 0.

11. An integrated circuit, comprising:
    two adjacent first memory blocks and two adjacent second memory blocks respectively disposed on two sides of the integrated circuit, wherein each of the two first memory blocks and the two second memory blocks comprises a memory cell array having a three-dimensional architecture and a shortest spacing distance between the memory cell array of the two adjacent first memory blocks; and
    a pad disposing area disposed between the two adjacent first memory blocks and the two adjacent second memory blocks, wherein a plurality of pads are disposed in the pad disposing area, and the pads are respectively electrically coupled to the two adjacent first memory blocks and the two adjacent second memory blocks,
    wherein each of the two adjacent first memory block comprises a first control circuit generating a first control signal to control an access operation of the corresponding first memory cell array, each of the two adjacent second memory block comprises a second control circuit generating a second control signal to control an access operation of the corresponding second memory cell array, and the two first control circuits and the second control circuits are symmetrically disposed about the pad disposing area.

12. The integrated circuit according to claim 11, wherein the shortest spacing distance is less than $1/200$ of a length the memory cell array of the first memory block.

13. The integrated circuit according to claim 11, further comprises a sensing circuit under the memory cell array.

14. The integrated circuit according to claim 11, wherein each of the two first memory blocks and the two second memory blocks comprises an address decoding circuit adjacent to the memory cell array and under a staircase structure.

* * * * *